United States Patent
Lo et al.

(10) Patent No.: US 12,474,525 B2
(45) Date of Patent: Nov. 18, 2025

(54) SEMICONDUCTOR DEVICE AND FABRICATION METHOD THEREOF

(71) Applicant: Vanguard International Semiconductor Corporation, Hsinchu (TW)

(72) Inventors: Ming-Cheng Lo, New Taipei (TW); Shih-Chang Huang, Hsinchu (TW); Jui-Chun Chang, Hsinchu (TW); Wu-Hsi Lu, Hsinchu (TW); Yu-Che Tsai, Hsinchu (TW); Shih-Hao Liu, Taoyuan (TW); Yen-Shih Ho, Taoyuan (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 251 days.

(21) Appl. No.: 18/533,196

(22) Filed: Dec. 8, 2023

(65) Prior Publication Data
US 2025/0189723 A1    Jun. 12, 2025

(51) Int. Cl.
*G02B 6/12*   (2006.01)
*G02B 6/13*   (2006.01)

(52) U.S. Cl.
CPC ...... *G02B 6/13* (2013.01); *G02B 2006/12061* (2013.01); *G02B 2006/12142* (2013.01)

(58) Field of Classification Search
CPC .. G02B 6/13; G02B 6/12; G02B 2006/12061; G02B 2006/12142
See application file for complete search history.

(56) References Cited

U.S. PATENT DOCUMENTS

| | | | |
|---|---|---|---|
| 7,050,304 B2* | 5/2006 | Hsu | H01L 25/0655 |
| | | | 257/E23.102 |
| 9,496,248 B2* | 11/2016 | Lee | H01L 25/0655 |
| 9,864,133 B2* | 1/2018 | Patel | G02B 6/34 |
| 11,526,037 B2 | 12/2022 | Park | |
| 2007/0077018 A1 | 4/2007 | Doan | |

FOREIGN PATENT DOCUMENTS

CN    111063681 A    4/2020

* cited by examiner

*Primary Examiner* — Jennifer Doan
(74) *Attorney, Agent, or Firm* — Winston Hsu (57) ABSTRACT

A method of fabricating a semiconductor device includes providing a substrate that includes a handle substrate, a bottom cladding layer, and a semiconductor layer stacked in sequence from bottom to top. The substrate includes an electronic integrated circuit (EIC) region and a photonic integrated circuit (PIC) region. A thermal oxidation process is performed on the semiconductor layer in the PIC region to form an oxide layer. A first thickness of the semiconductor layer in the EIC region is greater than a second thickness of the semiconductor layer below the oxide layer. The oxide layer is removed and a PIC structure is formed on the bottom cladding layer in the PIC region. An EIC structure is formed on the bottom cladding layer in the EIC region. An interconnect structure is formed to be electrically connected to the PIC and EIC structures.

20 Claims, 10 Drawing Sheets

SEMICONDUCTOR DEVICE AND FABRICATION METHOD THEREOF

BACKGROUND OF THE INVENTION

1. Field of the Invention

The present disclosure relates generally to semiconductor technology, and more particularly to a semiconductor device combining electronic integrated circuits and photonic integrated circuits and a fabrication method thereof.

2. Description of the Prior Art

Electronic integrated circuits (EICs) generally use electrons to transmit signals and perform calculations, and use copper wires to connect various components. Photonic integrated circuits (PICs) mainly use photons for signal transmission and calculation, and use optical waveguides to connect various components. Compared with electrons, photons are suitable for wider bandwidth and have faster data transmission speed, which can provide higher transmission rate, large amount of data transmission and better communication quality for the computing, transmission and sensing industries. In various applications, PICs need to be combined with EICs. The manufacturing processes of EICs and PICs are very different, thus EICs and PICs are usually fabricated separately on different chips. Then, these different chips are packaged on the same carrier through co-packaging technology, so that the optical signals of the PICS and the electrical signals of the EICs are converted and processing. However, the combination of EICs and PICs still needs to be improved for reducing the losses in electrical signals and high-speed operations.

SUMMARY OF THE INVENTION

In view of this, the present disclosure provides a semiconductor device and a fabrication method thereof. The semiconductor device combines electronic integrated circuits (EICs) and photonic integrated circuits (PICs) on a single chip, thereby shortening the electrical transmission path and reducing transmission loss and signal delay. Moreover, EICs and PICs are fabricated simultaneously in the same process steps, thereby reducing the costs and the time of fabricating EICs and PICs. In addition, the semiconductor device is conducive to the miniaturization of EICs and PICs.

According to an embodiment of the present disclosure, a method of fabricating a semiconductor device is provided and includes the following steps. A substrate is provided and includes a handle substrate, a bottom cladding layer, and a semiconductor layer stacked in sequence from bottom to top. The substrate includes an electronic integrated circuit (EIC) region and a photonic integrated circuit (PIC) region. A thermal oxidation process is performed on the semiconductor layer in the PIC region to form an oxide layer, and a first thickness of the semiconductor layer in the EIC region is greater than a second thickness of the semiconductor layer below the oxide layer. The oxide layer is removed and a PIC structure is formed on the bottom cladding layer in the PIC region. An EIC structure is formed on the bottom cladding layer in the EIC region. In addition, an interconnect structure is formed on the bottom cladding layer to be electrically connected to the PIC structure and the EIC structure.

According to an embodiment of the present disclosure, a semiconductor device is provided and includes a handle substrate, a bottom cladding layer, an electronic integrated circuit (EIC) structure, a photonic integrated circuit (PIC) structure, an interlayer dielectric layer and an interconnect structure. The bottom cladding layer is disposed on the handle substrate. The EIC structure is disposed on the bottom cladding layer. The EIC structure includes a semiconductor block having a first conductivity type. The PIC structure is disposed on the bottom cladding layer and laterally separated from the EIC structure. The PIC structure includes an optical waveguide. The semiconductor block has a first thickness, the optical waveguide has a second thickness, and the first thickness is greater than the second thickness. The interlayer dielectric layer covers the EIC structure and the PIC structure. The interconnection structure is disposed in the interlayer dielectric layer and is electrically connected to the EIC structure and the PIC structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 208, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor device combining electronic integrated circuits (EICs) and photonic integrated circuits (PICs) and a fabrication method thereof. A semiconductor-on-insulator (SOI) substrate is used to fabricate an EIC structure and a PIC structure simultaneously on a single chip by the same process steps. The thickness of a portion of a semiconductor layer used to fabricate the EIC structure is greater than the thickness of another portion of the semiconductor layer used to fabricate the PIC structure. For the combination of EICs and PICs, the semiconductor device of the present disclosure can shorten the electrical transmission path, reduce transmission losses and signal delays, and also reduce the costs and the time of fabricating the EIC structure and the PIC structure. Moreover, the semiconductor device of the present disclosure is conducive to the miniaturization of EICs and PICs.

Figure 1:
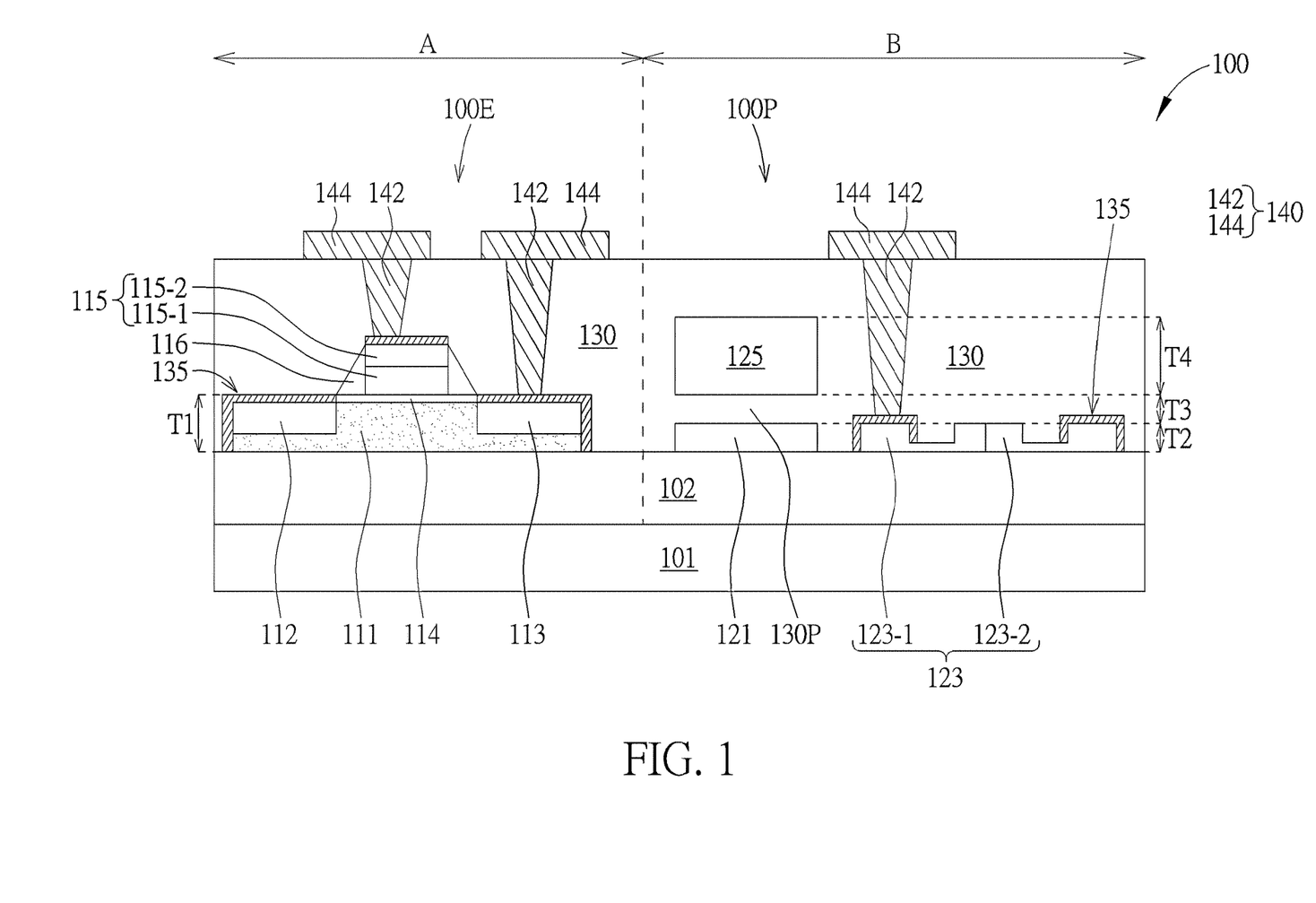
FIG. 1 is a schematic cross-sectional view of a semiconductor device according to an embodiment of the present disclosure.

FIG. 1 is a schematic cross-sectional view of a semiconductor device 100 according to an embodiment of the present disclosure. The semiconductor device 100 includes an electronic integrated circuit (EIC) region A and a photonic integrated circuit (PIC) region B. A handle substrate 101 and a bottom cladding layer 102 are used in both the EIC region A and the PIC region B. The bottom cladding layer 102 is disposed on the handle substrate 101. In some embodiments, the handle substrate 101 is a semiconductor substrate such as a silicon wafer, and the bottom cladding layer 102 is a buried oxide (BOX) layer such as a silicon oxide layer. An EIC structure 100E is disposed on the bottom cladding layer 102 and includes a semiconductor block 111 having a first conductivity type, such as a P-type well region or an N-type well region, where the semiconductor block 111 has a first thickness T1. A PIC structure 100P is also disposed on the bottom cladding layer 102 and laterally separated from the EIC structure 100E. The PIC structure 100P includes an optical waveguide 121 having a second thickness T2. The first thickness T1 of the semiconductor block 111 is greater than the second thickness T2 of the optical waveguide 121.

In some embodiments, the first thickness T1 is from about 600 nanometers (nm) to about 10, 000 nm, and the second thickness T2 is from about 100 nm to about 500 nm, but not limited thereto. The first thickness T1 and the second thickness T2 may be adjusted according to the characteristics of the EIC structure 100E and the PIC structure 100P. The range of the first thickness T1 allows the semiconductor block 111 to provide enough space for manufacturing various electronic components of the EIC structure 100E. The range of the second thickness T2 is based on the characteristic requirements of various photonic components of the PIC structure 100P. According to some embodiments of the present disclosure, the semiconductor block 111 and the optical waveguide 121 are both formed from a semiconductor layer (not shown) on the bottom cladding layer 102. The composition of the semiconductor block 111 and the composition of the optical waveguide 121 include the same semiconductor material. Moreover, the handle substrate 101, the bottom cladding layer 102 and the aforementioned semiconductor layer are provided by a semiconductor-on-insulator (SOI) substrate. In general, the thickness of a portion of the semiconductor layer required for manufacturing electronic components is greater than the thickness of another portion of the semiconductor layer required for manufacturing photonic components. According to some embodiments of the present disclosure, the EIC structure 100E and the PIC structure 100P are fabricated simultaneously on the same SOI substrate by using the same process steps.

Still referring to FIG. 1, the EIC structure 100E includes a source region 112 and a drain region 113 disposed in the semiconductor block 111. The source region 112 and the drain region 113 have a second conductivity type that is opposite to the first conductivity type of the semiconductor block 111. In some embodiments, the semiconductor block 111 is, for example, a P-type well region (PW), and both the source region 112 and the drain region 113 are, for example, N-type heavily doped regions (N+). Alternatively, the semiconductor block 111 is an N-type well region (NW), and the source region 112 and the drain region 113 are both P-type heavily doped regions (P+). In addition, the EIC structure 100E includes a gate dielectric layer 114 disposed on the semiconductor block 111, a gate electrode 115 disposed on the gate dielectric layer 114, and a spacer 116 disposed on the sidewalls of the gate electrode 115. In one embodiment, the gate electrode 115 may include a polysilicon block 115-1 and a doped region 115-2 located on the top surface of the gate electrode 115. The doped region 115-2 may have the second conductivity type that is the same as the conductivity type of both the source region 112 and the drain region 113. In another embodiment, the composition of the gate electrode 115 may be metal or other conductive materials.

In addition, the PIC structure 100P includes an optical modulator 123 that is disposed on the bottom cladding layer 102 and laterally separated from the optical waveguide 121. The optical modulator 123 includes a first portion 123-1 and a second portion 123-2 with opposite conductivity types. In one embodiment, the first portion 123-1 may have the first conductivity type, such as a P-type doped region, and the second portion 123-2 may have the second conductivity type, such as an N-type doped region. Furthermore, the optical modulator 123 and the optical waveguide 121 are both formed from a semiconductor layer on the bottom cladding layer 102. The compositions of the optical modulator 123, the optical waveguide 121 and the semiconductor block 111 include the same semiconductor material. Moreover, the maximum thickness of the optical waveguide 123 may be the same as the second thickness T2 of the optical waveguide 121. In one embodiment, the PIC structure 100P may further include another optical waveguide 125 or other optical waveguides (not shown) disposed above the optical waveguide 121. The composition of the optical waveguide 125 may be different from the composition of the optical waveguide 121. For example, the composition of the optical waveguide 121 may be silicon, and the composition of the optical waveguide 125 may be silicon nitride. In addition, the optical waveguide 125 has a thickness T4. In one embodiment, the thickness T4 of the optical waveguide 125 is different from the second thickness T2 of the optical waveguide 121. The thickness T4 may be from about 300 nm to about 500 nm, but not limited thereto. The amounts, the compositions, the locations and the thicknesses of the optical waveguide 125 and other optical waveguides above the optical waveguide 121 may be adjusted according to the requirements of the PIC structure 100P.

As shown in FIG. 1, the semiconductor device 100 further includes an interlayer dielectric (ILD) layer 130 continuously disposed in the EIC region A and the PIC region B to cover the EIC structure 100E and the PIC structure 100P. In addition, the semiconductor device 100 includes an interconnect structure 140 disposed in the ILD layer 130 and located on the bottom cladding layer 102. The interconnect structure 140 is distributed in both the EIC region A and the PIC region B to be electrically connected to the EIC structure 100E and the PIC structure 100P. The interconnect structure 140 may include multiple vias 142 disposed in the ILD layer 130 and multiple wire layers 144 disposed on the ILD layer 130. In order to make the figure concise and easy to understand, FIG. 1 only shows one layer of vias 142 and one wire layer 144. The interconnect structure 140 may include multiple layers of the vias 142 and multiple wire layers 144 to achieve the required electrical connections. Moreover, a portion 130P of the ILD layer 130 is located between the optical waveguide 121 and another optical waveguide 125. The top surface of the portion 130P of the ILD layer 130 is lower than the top surface of the gate electrode 115. The portion 130P of the ILD layer 130 has a thickness T3. In one embodiment, the thickness T3 is from about 300 nm to about 400 nm, but not limited thereto. The thickness T3 is controlled by the process steps of forming the ILD layer 130 according to the requirements of the PIC structure 100P, so as to achieve the required distance between the optical waveguide 121 and another optical waveguide 125.

Furthermore, the semiconductor device 100 may include a silicide layer 135 disposed on the top surfaces of the gate electrode 115, the source region 112 and the drain region 113 and also on the sidewalls of the semiconductor block 111 of the EIC structure 100E. Moreover, the silicide layer 135 is also disposed on the top surface and the sidewalls of the optical modulator 123 of the PIC structure 100P. For example, some portions of the silicide layer 135 are located on the first portion 123-1 and the second portion 123-2 of the optical modulator 123, respectively. The multiple vias 142 of the interconnect structure 140 may be respectively in contact with and electrically connected to some portions of the silicide layer 135 located on the gate electrode 115, the drain region 113, and the first portion 123-1 and the second portion 123-2 of the optical modulator 123. The silicide layer 135 is helpful to the electrical connection between both the EIC structure 100E and the PIC structure 100P and the interconnect structure 140.

Figure 2:
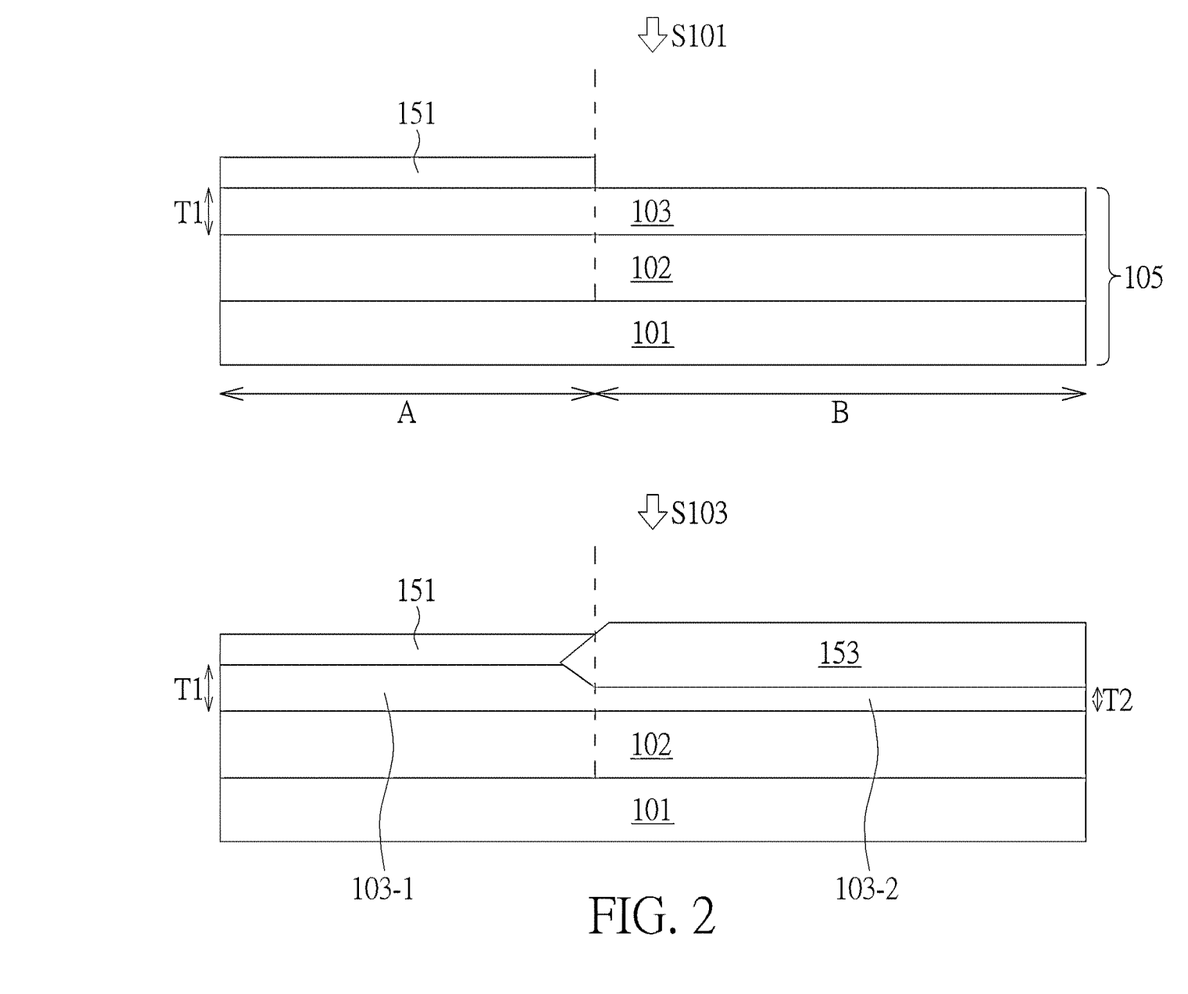
FIG. 2, FIG. 3, FIG. 4, FIG. 5, FIG. 6, FIG. 7, FIG. 8, FIG. 9 and FIG. 10 are schematic cross-sectional views of some stages of a method of fabricating a semiconductor device according to an embodiment of the present disclosure.

FIG. 2, FIG. 3, FIG. 4, FIG. 5, FIG. 6, FIG. 7, FIG. 8, FIG. 9 and FIG. 10 are schematic cross-sectional views of some stages of a method of fabricating a semiconductor device 100 according to an embodiment of the present disclosure. Referring to FIG. 2, in step S101, firstly, a substrate 105 such as an SOI substrate is provided. The substrate 105 includes a handle substrate 101, a bottom cladding layer 102 and a semiconductor layer 103 stacked in sequence from bottom to top. In some embodiments, the handle substrate 101 is a semiconductor substrate. The composition of the handle substrate 101 may be silicon (Si), germanium (Ge) or group III-V compound semiconductors, such as indium phosphide (InP), gallium arsenide (GaAs), etc., but not limited thereto. The bottom cladding layer 102 may be a buried oxide (BOX) layer. The composition of the bottom cladding layer 102 may be silicon oxide. Moreover, the refractive index of the bottom cladding layer 102 is lower than the refractive index of the semiconductor layer 103. The composition of the semiconductor layer 103 may be Si, Ge, or group III-V compound semiconductors, such as InP, GaAs, etc., but not limited thereto. In some embodiments, the handle substrate 101 is a silicon wafer, the bottom cladding layer 102 is a buried oxide layer, and the semiconductor layer 103 is a silicon layer. The semiconductor layer 103 has a first thickness T1, for example, from about 600 nm to about 10,000 nm. In addition, the substrate 105 includes an EIC region A and a PIC region B. In step S101, a patterned hard mask 151 is formed on the substrate 105 to cover the semiconductor layer 103 in the EIC region A, and the semiconductor layer 103 in the PIC region B is exposed. Still referring to FIG. 2, in step S103, a thermal oxidation process is performed on the exposed semiconductor layer 103 in the PIC region B to form an oxide layer 153. After the oxide layer 153 is formed, the thickness of the semiconductor layer in the PIC region B is reduced from the first thickness T1 to a second thickness T2. The second thickness T2 is, for example, from about 100 nm to about 500 nm. As a result, the first thickness T1 of a semiconductor layer 103-1 in the EIC region A is greater than the second thickness T2 of a semiconductor layer 103-2 located below the oxide layer 153. In one embodiment, the first thickness T1 may be about 600 nm, and the second thickness T2 may be about 220 nm.

Figure 3:
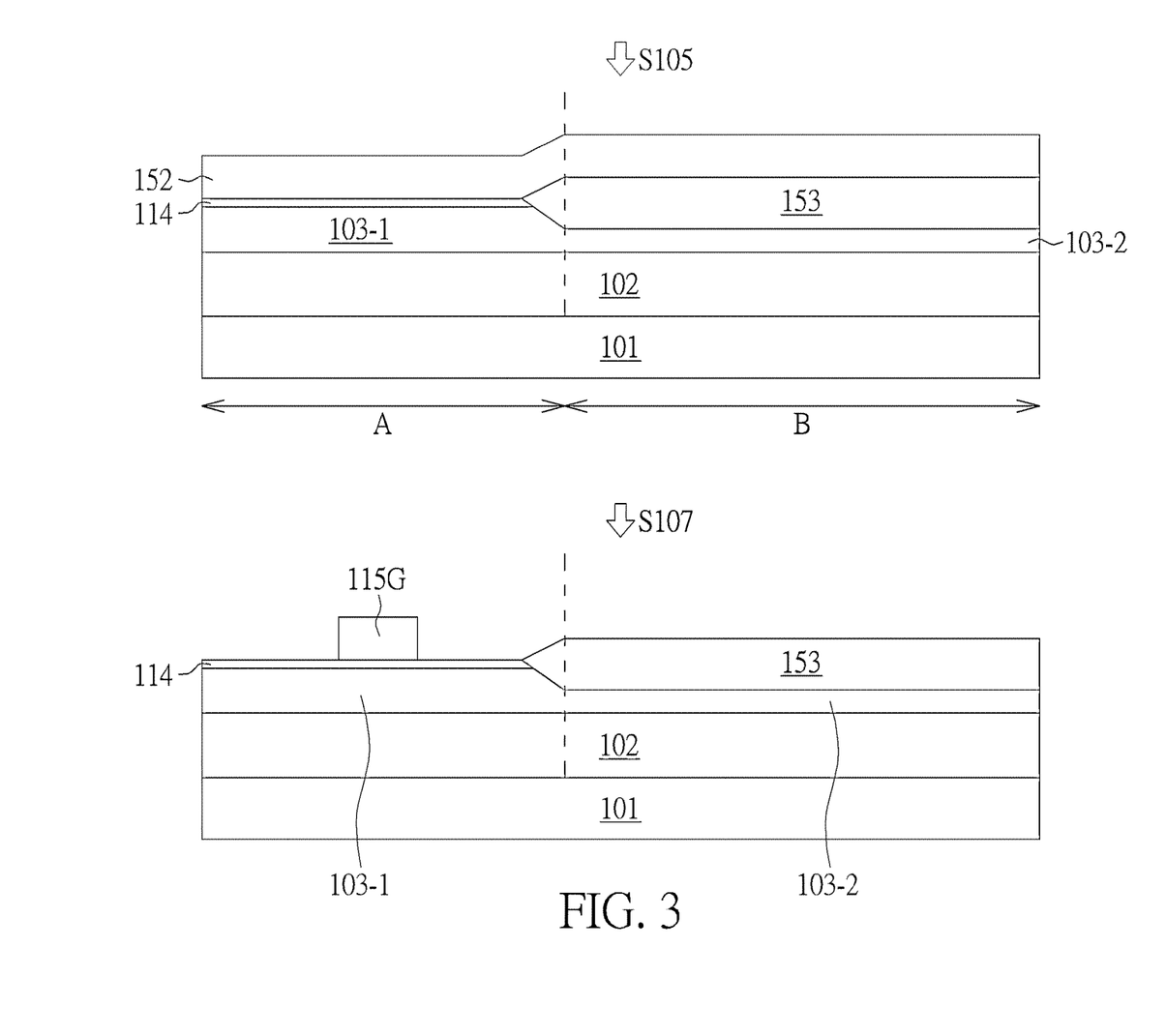

Next, referring to FIG. 3, in step S105, the patterned hard mask 151 is removed by a stripping process, such as an ashing or a soaking process, and the oxide layer 153 is remained. Then, a gate dielectric layer 114 such as a silicon oxide layer is formed on the semiconductor layer 103-1 in the EIC region A by a thermal oxidation or a deposition process. Thereafter, a gate material layer 152 such as a polysilicon layer is formed in both the EIC region A and the PIC region B by a deposition process. The gate material layer 152 is conformally formed to cover the gate dielectric layer 114 and the oxide layer 153. Still referring to FIG. 3, in step S107, the gate material layer 152 is patterned by photolithography and etching processes to form a gate electrode structure 115G such as a polysilicon block on the gate dielectric layer 114.

Figure 4:
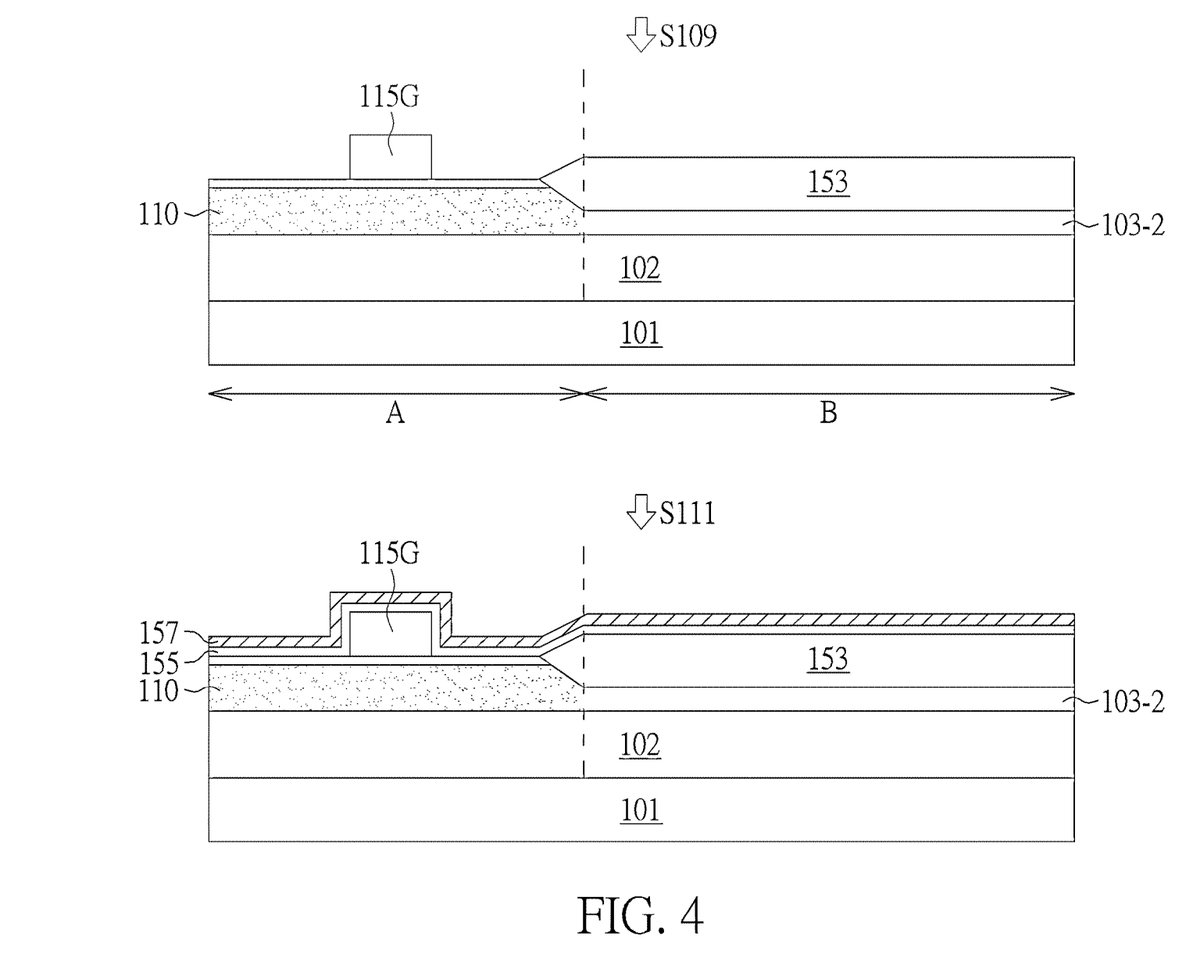

Then, referring to FIG. 4, in step S109, an ion implantation process is performed on the semiconductor layer 103-1 in the EIC region A to form a doped semiconductor layer 110. In one embodiment, the doped semiconductor layer 110 has the first conductivity type, such as a P-type silicon layer, which is used to form a well region of an EIC structure. Moreover, in step S109, the semiconductor layer 103-2 in the PIC region B is covered by the oxide layer 153 and thus the semiconductor layer 103-2 is not doped. Still referring to FIG. 4, in step S111, a first spacer material layer 155 such as a silicon oxide layer is formed in both the EIC region A and the PIC region B by a thermal oxidation or a deposition process. The first spacer material layer 155 is conformally formed on the gate dielectric layer 114, the gate electrode structure 115G and the oxide layer 153. Then, a second spacer material layer 157 such as a silicon nitride layer is formed in both the EIC region A and the PIC region B by another deposition process. The second spacer material layer 157 is conformally formed on the first spacer material layer 155.

Figure 5:
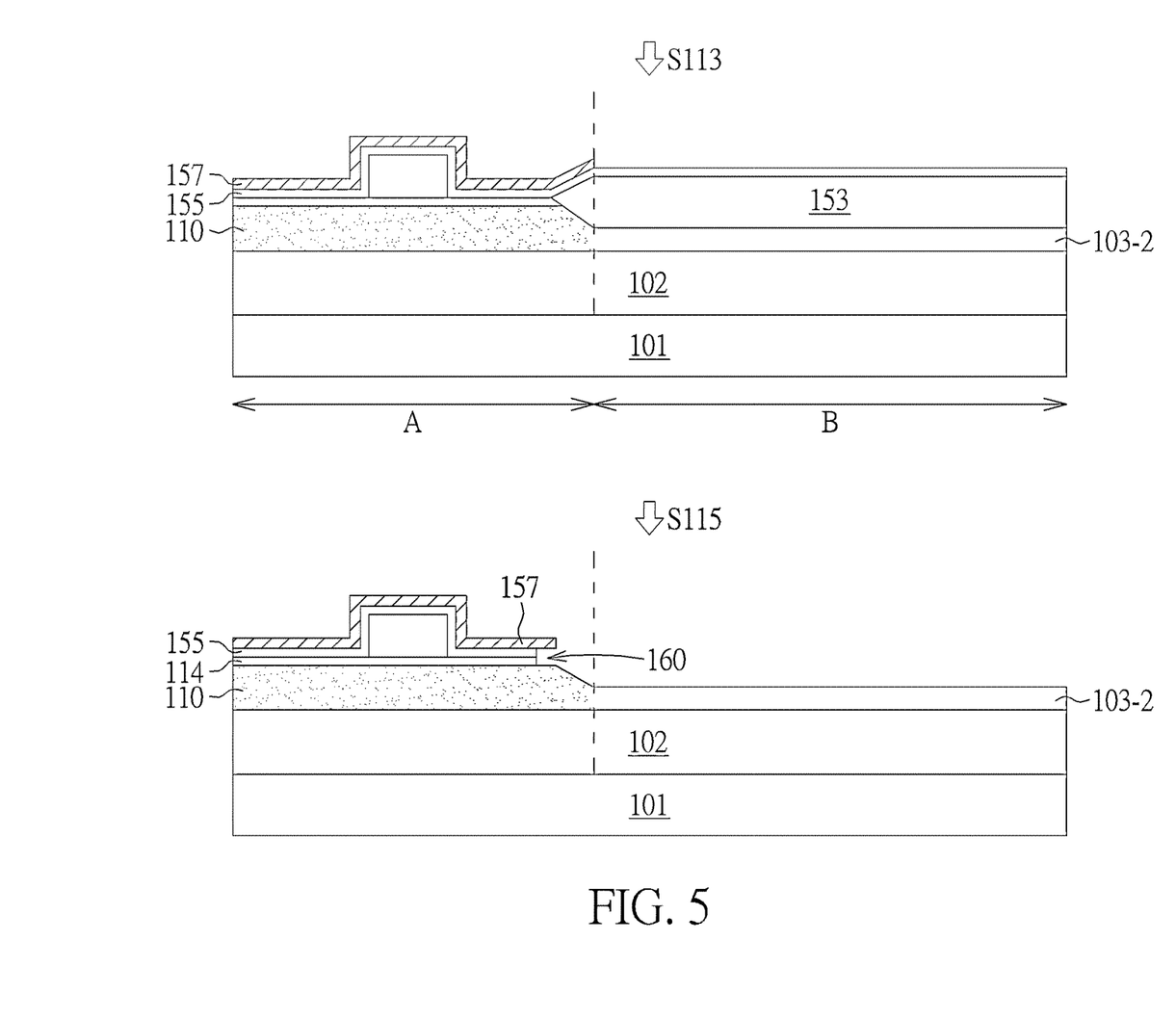

Afterwards, referring to FIG. 5, in step S113, the second spacer material layer 157 located in the PIC region B is removed by photolithography and etching processes, so that the first spacer material layer 155 is remained on the gate dielectric layer 114, the gate electrode structure 115G and the oxide layer 153, and the second spacer material layer 157 is remained on the first spacer material layer 155 in the EIC region A. The first spacer material layer 155 and the second spacer material layer 157 are also remained on the edge of the oxide layer 153 at the interface between the EIC region A and the PIC region B. Still referring to FIG. 5, in step S115, the oxide layer 153 and the first spacer material layer 155 on the oxide layer 153 are both removed by a wet etching process such as using a hydrofluoric acid solution. The second spacer material layer 157 on the edge of the oxide layer 153 is also removed. During the removal of the oxide layer 153, the second spacer material layer 157 located in the EIC region A may cover and protect the first spacer material layer 155 and the gate dielectric layer 114. After the wet etching process of the step S115, the edge of the first spacer material layer 155 and the edge of the gate dielectric layer 114 in the EIC region A are shrank inwards compared with the edge of the second spacer material layer 157, thereby producing an undercut 160 below the second spacer material layers 157. The undercut 160 does not affect the portion of the gate dielectric layer 114 and the portion of the first spacer material layer 155 those need to be retained.

Figure 6:
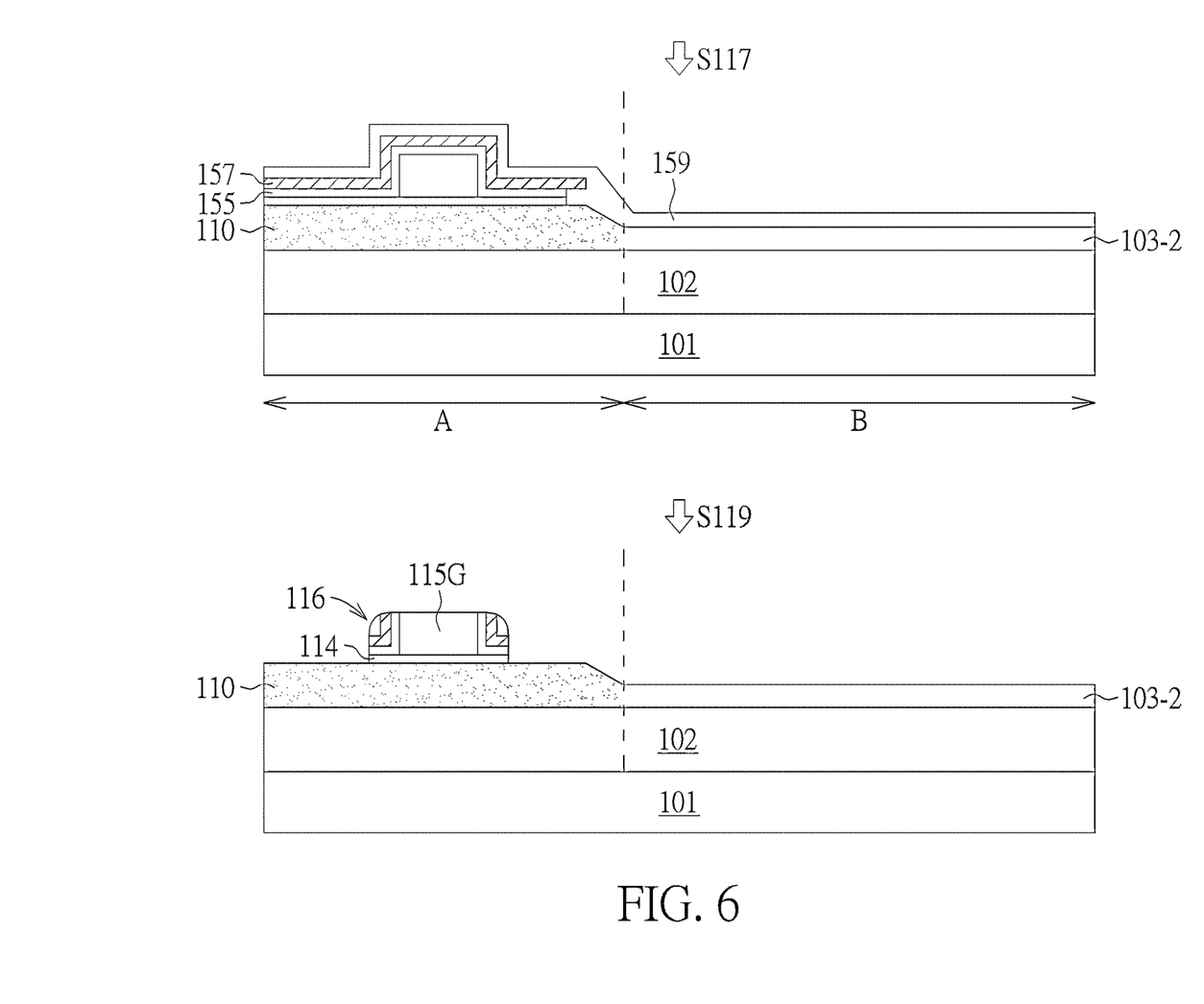

Next, referring to FIG. 6, in step S117, after the oxide layer 153 is removed, a third spacer material layer 159 such as silicon oxide layer is formed in both the EIC region A and the PIC region B by a deposition process. The third spacer material layer 159 is conformally formed to cover the semiconductor layer 103-2 in the PIC region B and the second spacer material layer 157. Moreover, the third spacer material layer 159 fills up the space produced by the undercut below the second spacer material layer 157. Still referring to FIG. 6, in step S119, the horizontal portion of the third spacer material layer 159, the horizontal portion of the second spacer material layer 157 and the horizontal portion of the first spacer material layer 155 are remove by an anisotropic dry etching process, thereby forming a spacer 116 on the sidewalls of the gate electrode structure 115G. In this embodiment, the spacer 116 may have an oxide-nitride-oxide (ONO) structure.

Figure 7:
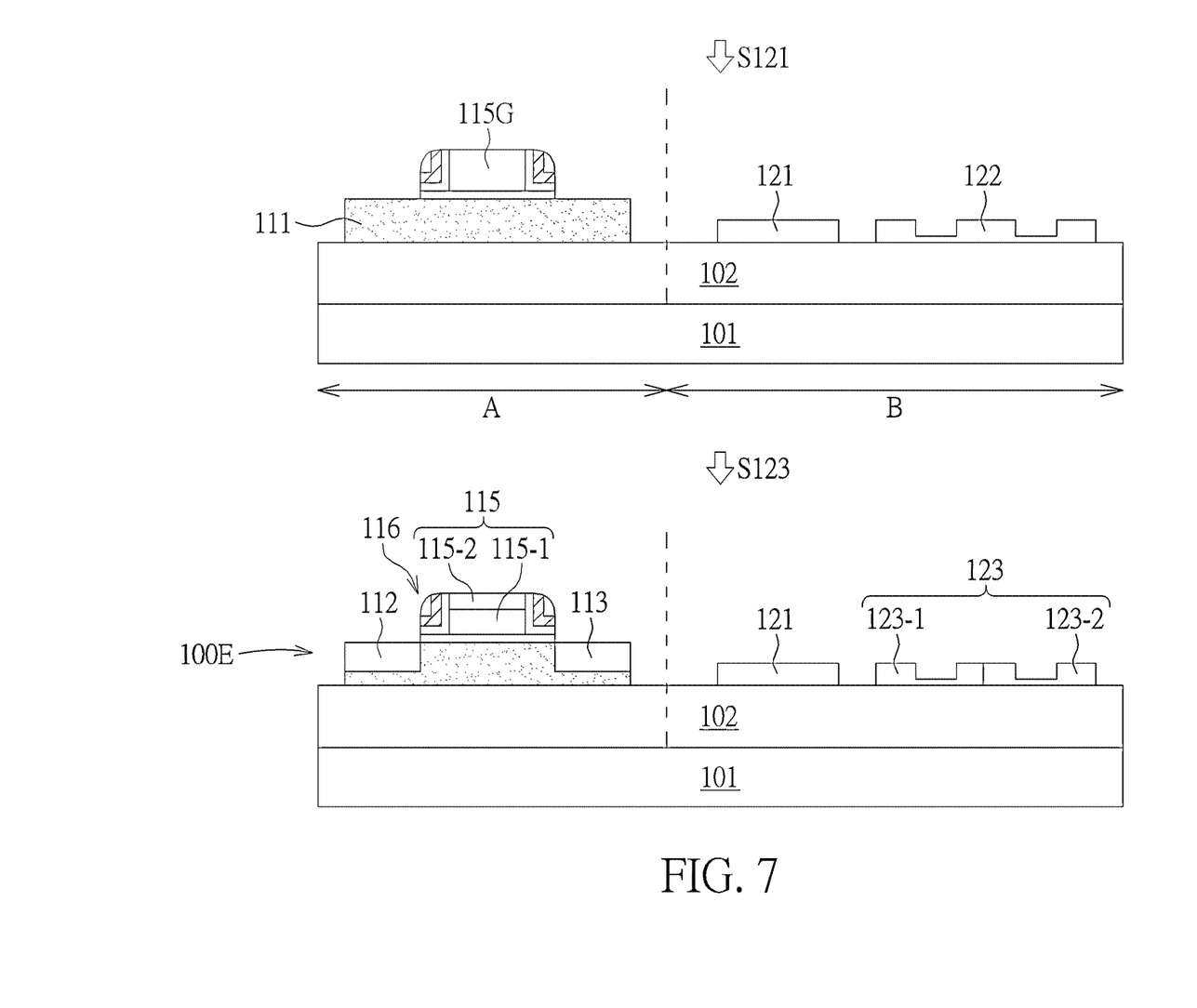

Thereafter, referring to FIG. 7, in step S121, the doped semiconductor layer 110 in the EIC region A is patterned by photolithography and etching processes to form a semiconductor block 111. In addition, the semiconductor layer 103-2 in the PIC region B is patterned by another photolithography and etching processes to form an optical waveguide 121 and an initial structure 122 of an optical modulator. The concave and convex profiles on the surface of the initial structure 122 of the optical modulator may be formed by multiple photolithography process steps and multiple etching process steps. Still referring to FIG. 7, in step S123, an ion implantation process is performed on the semiconductor block 111 in the EIC region A to form a source region 112 and a drain region 113, thereby completing an EIC structure 100E. In addition, a doped region 115-2 may also be formed on the top of the gate electrode structure 115G by the aforementioned ion implantation process, so that a gate electrode 115 including the polysilicon block 115-1 and the doped region 115-2 is formed. The source region 112, the drain region 113 and the doped region 115-2 all have the conductivity type opposite to that of the semiconductor block 111. In one embodiment, the semiconductor block 111 has the first conductivity type, such as a P-type well region. The source region 112, the drain region 113 and the doped region 115-2 all have the second conductivity type, such as N-type heavily doped regions (N+). In addition, in step S123, two ion implantation processes with opposite conductivity types are performed on the initial structure 122 of the optical modulator in the PIC region B to form a first portion 123-1 with the first conductivity type and a second portion 123-2 with the second conductivity type. The first portion 123-1 is, for example, a P-type doped region, and the second portion 123-2 is, for example, an N-type doped region. The first portion 123-1 and the second portion 123-2 constitute an optical modulator 123. In some embodiments, the first portion 123-1 may include multiple P-type doped regions with different doping concentrations, and the second portion 123-2 may include multiple N-type doped regions with different doping concentrations. Moreover, the required doped regions may be simultaneously formed in the EIC region A and the PIC region B through the same ion implantation process.

Figure 8:
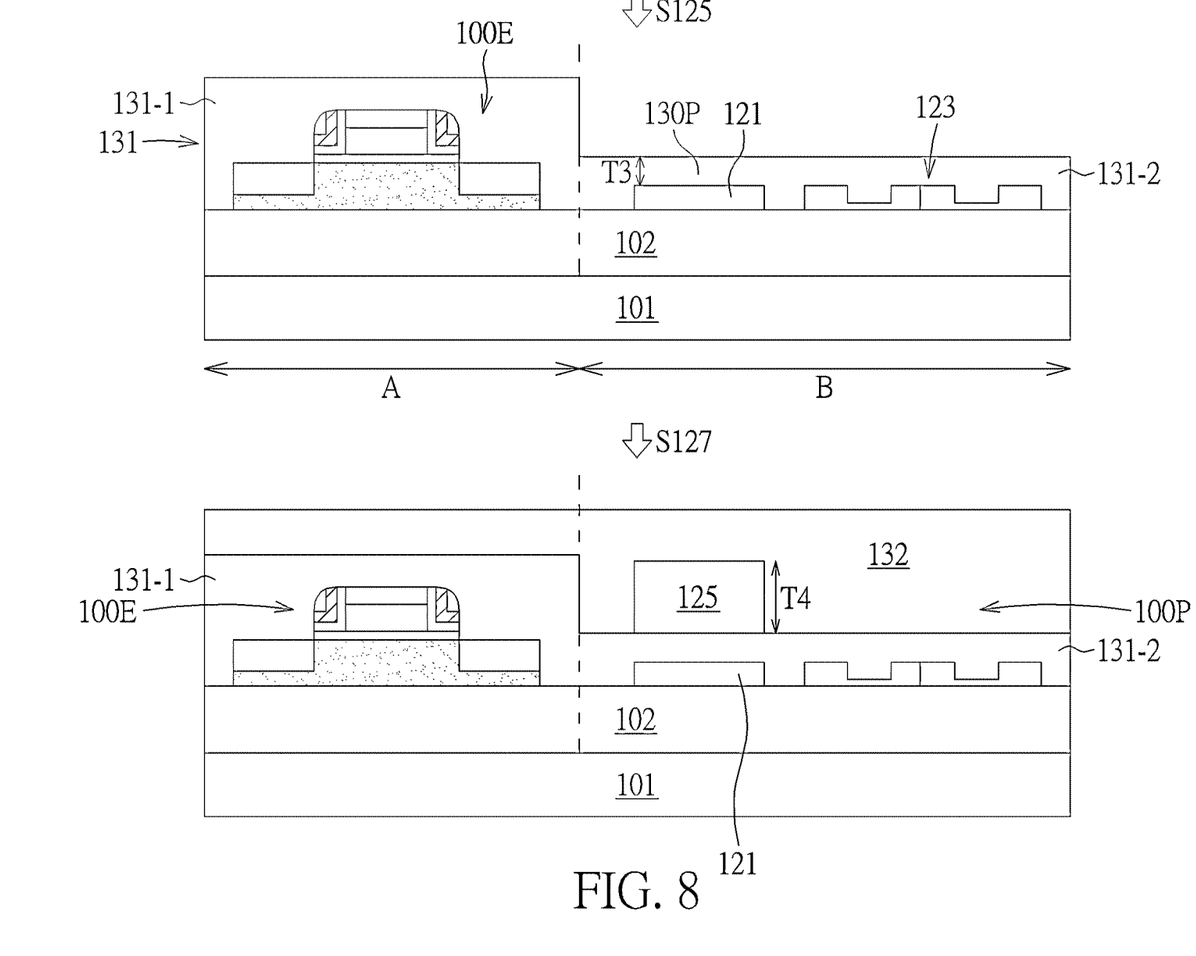

Next, referring to FIG. 8, in step S125, a first dielectric layer 131 such as a silicon oxide layer is deposited in both the EIC region A and the PIC region B to cover the EIC structure 100E, the optical waveguide 121 and the optical modulator 123. Then, a chemical mechanical planarization (CMP) process is performed on the first dielectric layer 131, so that the first dielectric layer 131 has a flat top surface. Thereafter, a patterned photoresist (not shown) is formed to cover the first dielectric layer 131 in the EIC region A, and the first dielectric layer 131 in the PIC region B is exposed. Then, an etching back process is performed on the first dielectric layer 131 in the PIC region B to remove the upper portion of the first dielectric layer 131 in the PIC region B, and the lower portion of the first dielectric layer 131 is remained. Therefore, the top surface of a first portion 131-1 of the first dielectric layer 131 in the EIC region A is higher than the top surface of a second portion 131-2 of the first dielectric layer 131 in the PIC region B. After the etching back process of the step S125, a portion 130P of an interlayer dielectric layer above the optical waveguide 121 has a thickness T3. In one embodiment, the thickness T3 is about 350 nm, but not limited thereto. The parameters of the etching back process in step S125 may be adjusted according to the requirements of PICS to control the thickness T3 of the portion 130P of the interlayer dielectric layer.

Still referring to FIG. 8, in step S127, another optical waveguide 125 is formed on the second portion 131-2 of the first dielectric layer 131 in the PIC region B by deposition and patterning processes to complete a PIC structure 100P. In one embodiment, the composition of the optical waveguide 125 is, for example, silicon nitride, and the optical waveguide 125 has a thickness T4, for example, about 400 nm, but not limited thereto. In addition, more optical waveguides may be formed above the optical waveguide 121 by multiple deposition process steps and multiple patterning process steps. Afterwards, a second dielectric layer 132 such as a silicon oxide layer is deposited in both the EIC region A and the PIC region B to cover the first portion 131-1 of the first dielectric layer 131, the optical waveguide 125 and the second portion 131-2 of the first dielectric layer 131. In addition, a CMP process is performed on the second dielectric layer 132, so that the second dielectric layer 132 has a flat top surface.

Figure 9:
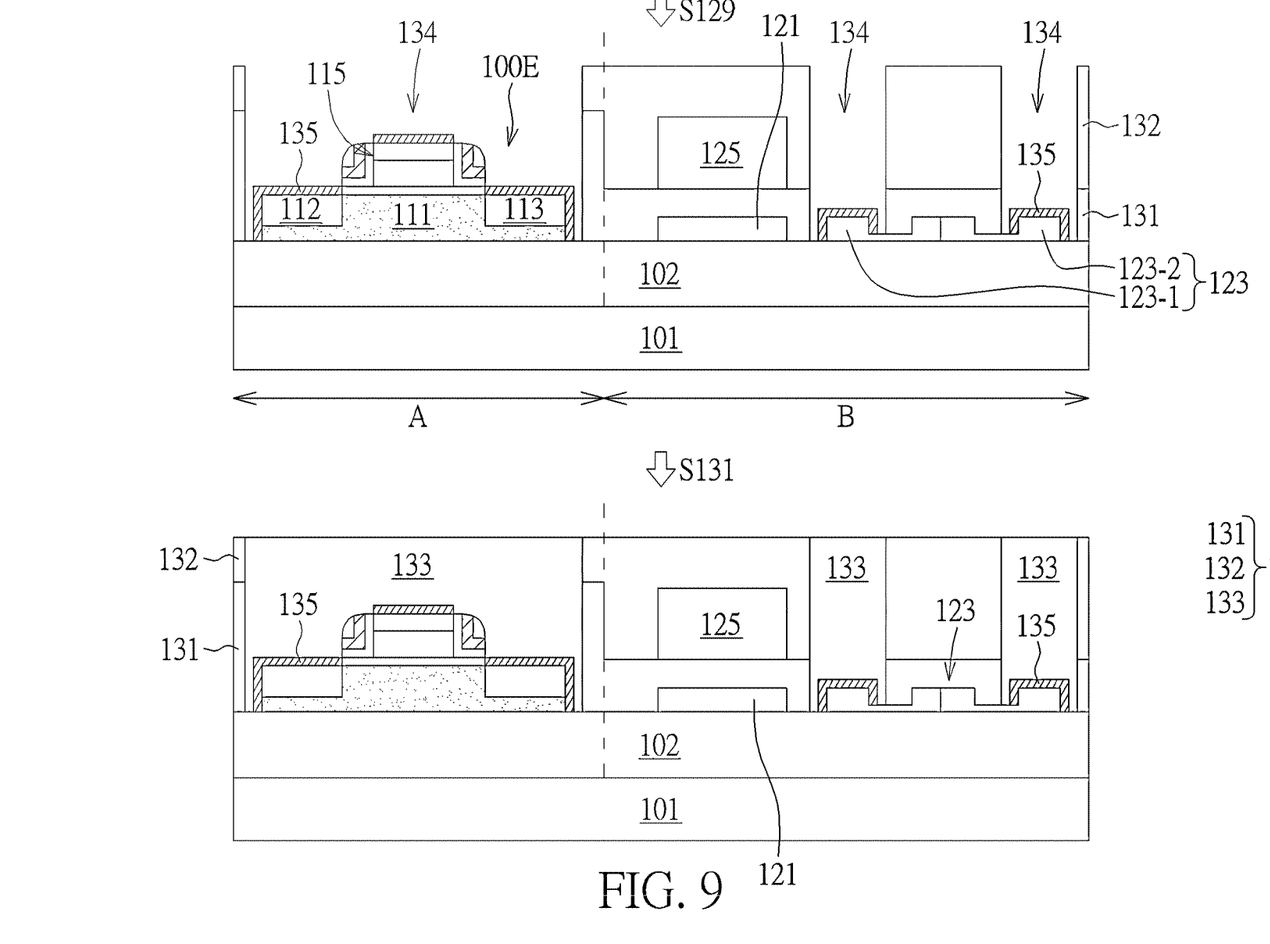

Then, referring to FIG. 9, in step S129, multiple openings 134 are formed in the first dielectric layer 131 and the second dielectric layer 132 by an etching process to expose the EIC structure 100E and the first portion 123-1 and the second portion 123-2 of the optical modulator 123, respectively. Next, a self-aligned silicide process is performed to deposit a metal material, such as titanium (Ti), cobalt (Co), nickel (Ni), nickel platinum (NiPt), etc., on the exposed surfaces of the EIC structure 100E and the first portion 123-1 and the second portion 123-2 of the optical modulator 123. Thereafter, a high temperature treatment is performed to allow the metal material to react with the silicon in the EIC structure 100E and the silicon in the first portion 123-1 and the second portion 123-2 of the optical modulator 123, thereby forming a silicide layer 135. The silicide layer 135 is formed on the top surfaces of the gate electrode 115, the source region 112 and the drain region 113, on the sidewalls of the semiconductor block 111, and on the top surfaces and the sidewalls of the first portion 123-1 and the second portion 123-2 of the optical modulator 123. Still referring to FIG. 9, in step S131, the multiple openings 134 in the first dielectric layer 131 and the second dielectric layer 132 are filled up with a dielectric material 133 such as silicon oxide by a deposition process, and the dielectric material 133 also covers the silicide layer 135. Then, a CMP process is performed on the dielectric material 133 to form an interlayer dielectric (ILD) layer 130, which includes the first dielectric layer 131, the second dielectric layer 132 and the dielectric material 133, and the ILD layer 130 has a flat top surface.

Figure 10:
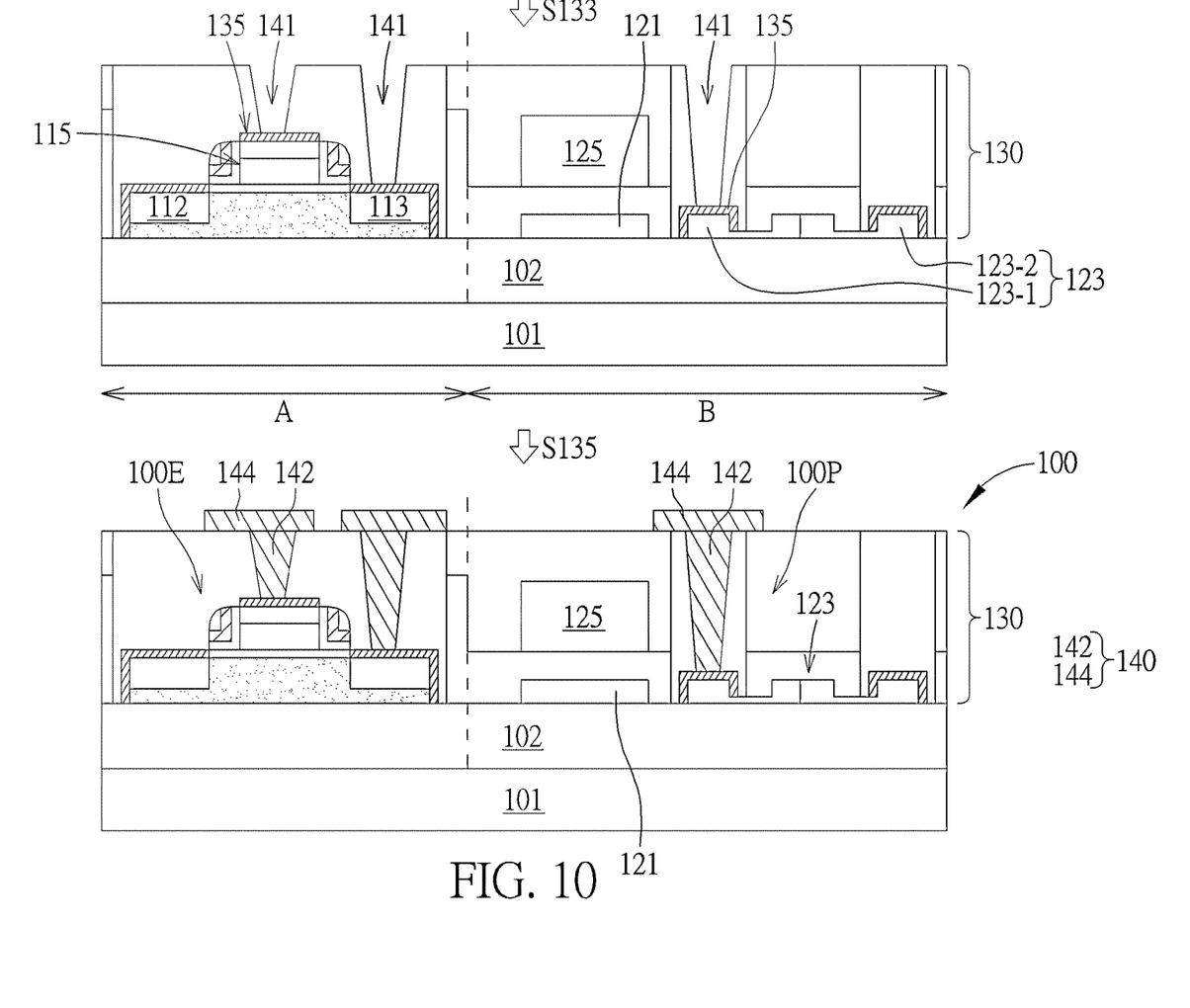

Next, referring to FIG. 10, in step S133, multiple holes 141 are formed in the ILD layer 130 by photolithography and etching processes. In one embodiment, multiple portions of the silicide layer 135 on the gate electrode 115, the drain region 113, and the first portion 123-1 of the optical modulator 123 are exposed through the multiple holes 141 respectively. Still referring to FIG. 10, in step S135, multiple vias 142 are respectively formed in the multiple holes 141 of the ILD layer 130 by deposition and patterning processes, and a wire layer 144 is also formed on the ILD layer 130. The vias 142 and the wire layer 144 constitute an interconnect structure 140 that is electrically connected to both the EIC structure 100E and the PIC structure 100P to complete the semiconductor device 100.

According to some embodiments of the present disclosure, the semiconductor device includes the EIC structure and the PIC structure manufactured simultaneously by using an SOI substrate and the same process steps. The cost and the time of manufacturing the EIC structure and the PIC structure are reduced. In addition, the EIC structure and the PIC structure are combined on a single chip in the semiconductor device of the present disclosure, thereby shortening the electrical transmission path, reducing transmission losses and signal delays, and improving the performances of the EIC structure and the PIC structure. Furthermore, it is conducive to the miniaturization of the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
    providing a substrate, comprising a handle substrate, a bottom cladding layer and a semiconductor layer stacked in sequence from bottom to top, wherein the substrate comprises an electronic integrated circuit (EIC) region and a photonic integrated circuit (PIC) region;
    performing a thermal oxidation process on the semiconductor layer in the PIC region to form an oxide layer, wherein a first thickness of the semiconductor layer in the EIC region is greater than a second thickness of the semiconductor layer below the oxide layer;
    removing the oxide layer;
    forming a photonic integrated circuit (PIC) structure on the bottom cladding layer in the PIC region;
    forming an electronic integrated circuit (EIC) structure on the bottom cladding layer in the EIC region; and
    forming an interconnect structure above the bottom cladding layer to be electrically connected to the PIC structure and the EIC structure.

2. The method of claim 1, wherein the first thickness is from 600 nanometers (nm) to 10,000 nm, and the second thickness is from 100 nm to 500 nm.

3. The method of claim 1, wherein forming the EIC structure comprises:
    forming a gate dielectric layer and a gate electrode on the semiconductor layer in the EIC region before removing the oxide layer; and
    performing an ion implantation process on the semiconductor layer in the EIC region to form a doped semiconductor layer before removing the oxide layer.

4. The method of claim 3, further comprising:
    forming a first spacer material layer and a second spacer material layer in sequence on the gate dielectric layer, the gate electrode and the oxide layer;
    removing the second spacer material layer located in the PIC region; and
    removing the oxide layer and the first spacer material layer on the oxide layer, wherein the second spacer material layer located in the EIC region covers the first spacer material layer and the gate dielectric layer.

5. The method of claim 4, wherein after the oxide layer and the first spacer material layer on the oxide layer are removed, an edge of the first spacer material layer and an edge of the gate dielectric layer are both shrank inwards compared with an edge of the second spacer material layer.

6. The method of claim 4, further comprising:
forming a third spacer material layer to cover the semiconductor layer in the PIC region and the second spacer material layer after the oxide layer is removed; and
removing a portion of the third spacer material layer, a portion of the second spacer material layer, and a portion of the first spacer material layer to form a spacer on sidewalls of the gate electrode.

7. The method of claim 3, wherein forming the EIC structure further comprises:
patterning the doped semiconductor layer to form a semiconductor block; and
performing an ion implantation process on the semiconductor block to form a source region and a drain region.

8. The method of claim 1, wherein forming the PIC structure comprises:
patterning the semiconductor layer in the PIC region to form an optical waveguide and an initial structure of an optical modulator after the oxide layer is removed; and
performing two ion implantation processes with opposite conductivity types on the initial structure to form the optical modulator.

9. The method of claim 8, further comprising:
forming a first dielectric layer to cover the optical waveguide, the optical modulator and the EIC structure;
removing an upper portion of the first dielectric layer located in the PIC region and remaining a lower portion of the first dielectric layer;
forming another optical waveguide on the lower portion of the first dielectric layer; and
forming a second dielectric layer to cover the first dielectric layer and the another optical waveguide.

10. The method of claim 9, further comprising:
forming a plurality of openings in the first dielectric layer and the second dielectric layer to expose the EIC structure and a portion of the optical modulator respectively; and
forming a silicide layer on the EIC structure and the portion of the optical modulator.

11. The method of claim 10, further comprising:
depositing a dielectric material to fill up the plurality of openings and cover the silicide layer to form an interlayer dielectric layer, wherein the interconnect structure is formed in the interlayer dielectric layer.

12. The method of claim 1, wherein before forming the oxide layer, forming a hard mask on the semiconductor layer in the EIC region to expose the semiconductor layer in the PIC region, and before removing the oxide layer, removing the hard mask.

13. A semiconductor device, comprising:
a handle substrate;
a bottom cladding layer, disposed on the handle substrate;
an electronic integrated circuit (EIC) structure, disposed on the bottom cladding layer, wherein the EIC structure comprises a semiconductor block having a first conductivity type;
a photonic integrated circuit (PIC) structure, disposed on the bottom cladding layer and laterally separated from the EIC structure, wherein the PIC structure comprises an optical waveguide;
an interlayer dielectric layer, covering the EIC structure and the PIC structure; and
an interconnect structure, disposed in the interlayer dielectric layer and electrically connected to the EIC structure and the PIC structure,
wherein the semiconductor block has a first thickness, the optical waveguide has a second thickness, and the first thickness is greater than the second thickness.

14. The semiconductor device of claim 13, wherein the first thickness is from 600 nanometers (nm) to 10,000 nm, and the second thickness is from 100 nm to 500 nm.

15. The semiconductor device of claim 13, wherein the PIC structure further comprises an optical modulator disposed on the bottom cladding layer and laterally separated from the optical waveguide, a maximum thickness of the optical modulator is the same as the second thickness of the optical waveguide, and the composition of the optical modulator and the composition of the optical waveguide comprise the same semiconductor material.

16. The semiconductor device of claim 15, wherein the EIC structure further comprises:
a source region and a drain region, both having a second conductivity type and disposed in the semiconductor block;
a gate dielectric layer, disposed on the semiconductor block;
a gate electrode, disposed on the gate dielectric layer; and
a spacer, disposed on sidewalls of the gate electrode.

17. The semiconductor device of claim 16, wherein the PIC structure further comprises another optical waveguide disposed above the optical waveguide, a portion of the interlayer dielectric layer is located between the optical waveguide and the another waveguide, and a top surface of the portion of the interlayer dielectric layer is lower than a top surface of the gate electrode.

18. The semiconductor device of claim 17, wherein the composition of the optical waveguide comprises silicon, and the composition of the another waveguide comprises silicon nitride.

19. The semiconductor device of claim 16, further comprising a silicide layer disposed on top surfaces of the gate electrode, the source region and the drain region, on sidewalls of the semiconductor block and on a top surface and sidewalls of the optical modulator.

20. The semiconductor device of claim 13, wherein the handle substrate comprises a semiconductor substrate, the bottom cladding layer comprises a buried oxide layer, and the composition of the semiconductor block and the composition of the optical waveguide comprise the same semiconductor material.

* * * * *